(12) United States Patent
Tsujimoto

(10) Patent No.: US 7,463,273 B2
(45) Date of Patent: Dec. 9, 2008

(54) PRINTER

(75) Inventor: Norito Tsujimoto, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 179 days.

(21) Appl. No.: 11/489,514

(22) Filed: Jul. 20, 2006

(65) Prior Publication Data

US 2007/0030311 A1 Feb. 8, 2007

(30) Foreign Application Priority Data

Aug. 2, 2005 (JP) ............... 2005-224360

(51) Int. Cl.
*B41J 2/32* (2006.01)
(52) U.S. Cl. .................................... 347/171
(58) Field of Classification Search ................ 347/171, 347/208, 194, 17, 14
See application file for complete search history.

(56) References Cited

U.S. PATENT DOCUMENTS 6,652,058 B2 * 11/2003 Kanematsu et al. ........... 347/14

FOREIGN PATENT DOCUMENTS

| JP | 2-162060 A | 6/1990 |
|---|---|---|
| JP | 10-48057 A | 2/1998 |
| JP | 11-307308 A | 11/1999 |
| JP | 2000-71507 A | 3/2000 |
| JP | 2000-338740 A | 12/2000 |
| JP | 2005-43162 A | 2/2005 |

OTHER PUBLICATIONS

European Search Report dated Nov. 17, 2006 (Five (5) Pages).

* cited by examiner

*Primary Examiner*—K. Feggins
(74) *Attorney, Agent, or Firm*—Crowell & Moring LLP

(57) ABSTRACT

A printer capable of correctly sensing the internal ambient temperature of a printer body with no influence by an electronic component such as a power supply component reaching a high temperature is obtained. This printer comprises a temperature sensor chip for sensing the internal ambient temperature of the printer body, the electronic component and a ground pattern formed on a wiring board for grounding the temperature sensor chip and the electronic component. A portion of the ground pattern connected to the temperature sensor chip is partially formed narrower than another portion of the ground pattern connected to the electronic component.

15 Claims, 6 Drawing Sheets

PRINTER

BACKGROUND OF THE INVENTION

1. Field of the Invention

The present invention relates to a printer, and more particularly, it relates to a printer having a temperature sensor chip.

2. Description of the Background Art

An electronic apparatus having a thermistor (temperature sensor) for sensing a temperature is known in general, as disclosed in Japanese Patent Laying-Open No. 10-48057 (1998), for example.

The electronic apparatus disclosed in the aforementioned Japanese Patent Laying-Open No. 10-48057 is provided with a thermistor for sensing the temperature of a power transistor element itself. In this electronic apparatus, a wiring pattern of the power transistor is partially widened and the thermistor is so mounted on a substrate that an element portion thereof is in close contact with the wide portion of the wiring pattern, whereby the thermistor can sense the temperature of the power transistor element itself through a wire. In the electronic apparatus disclosed in the aforementioned Japanese Patent Laying-Open No. 10-48057, however, the thermistor must be mounted on a hole of the substrate by soldering or the like, and hence manufacturing steps for the electronic apparatus is disadvantageously complicated.

In this regard, there is proposed an electronic apparatus provided with a chip-type thermistor (temperature sensor chip) allowing surface mounting, which is a system of mounting the thermistor on the surface of a substrate or the like by fitting the former into the latter. For example, Japanese Patent Laying-Open No. 11-307308 (1999) or 2005-43162 proposes this type of electronic apparatus.

The electronic apparatus proposed in the aforementioned Japanese Patent Laying-Open No. 11-307308 is provided with a chip-type thermistor (temperature sensor chip) formed on its lower portion with a projecting portion fittable into a substrate. This chip-type thermistor is so fitted into the substrate that a step of mounting the same on the substrate can be simplified. Further, the projecting portion is so provided on the lower portion of this chip-type thermistor as to come into contact with the substrate, whereby heat is easily conducted from the substrate to the chip-type thermistor. Thus, the chip-type thermistor according to Japanese Patent Laying-Open No. 11-307308 can sense the temperature of the substrate.

The electronic apparatus proposed in the aforementioned Japanese Patent Laying-Open No. 2005-431562 is provided with a diode whose temperature is to be sensed and a chip-type thermistor (temperature sensor chip) fittable into a substrate for sensing the temperature of the diode. This chip-type thermistor is so fitted into the substrate that a step of mounting the same on the substrate can be simplified. In this electronic apparatus according to Japanese Patent Laying-Open No. 2005-431562, first terminals of the thermistor and the diode are connected with each other through a conductor pattern grounded to the same ground pattern (not shown). Heat is transmitted from the diode to the thermistor through the conductor pattern, so that the thermistor senses the heat. Japanese Patent Laying-Open No. 2005-431562 also discloses a technique of improving conductivity of the heat from the diode to the thermistor by increasing the width of the conductor pattern.

On the other hand, a printer provided with a temperature sensor chip for sensing the internal ambient temperature of a printer body is proposed in general. In this printer, the temperature sensor chip and another electronic component such as a supply circuit are grounded to a common ground pattern provided over the entire region of a wiring board.

In the aforementioned conventional printer provided with the temperature sensor chip for sensing the internal ambient temperature of the printer body, however, a power supply component and the temperature sensor chip are grounded to the common ground pattern and hence heat is conducted from the power supply component or the like to the temperature sensor chip through the ground pattern. Therefore, the temperature sensor chip is so easily influenced by the heat of the power supply component or the like that it is difficult to correctly sense the internal ambient temperature of the printer body with the temperature sensor chip.

When the technique of the aforementioned Japanese Patent Laying-Open No. 11-307308 is applied to the temperature sensor chip sensing the internal ambient temperature of the body of the aforementioned conventional printer, the lower surface of the temperature sensor chip so comes into contact with the substrate that heat is easily transmitted from the substrate to the thermistor. Also in this case, therefore, the temperature sensor chip is so easily influenced by the heat of the substrate that it is difficult to correctly sense the internal ambient temperature of the printer body.

When the technique of the aforementioned Japanese Patent Laying-Open No. 2005-431562 is applied to the temperature sensor chip sensing the internal ambient temperature of the body of the aforementioned conventional printer, heat is easily conducted from the power supply component to the temperature sensor chip through the conductor pattern whose width is increased for improving heat conductivity. Also in this case, therefore, the temperature sensor chip is so easily influenced by the heat of the power supply component or the like that it is difficult to correctly sense the internal ambient temperature of the printer body.

SUMMARY OF THE INVENTION

The present invention has been proposed in order to solve the aforementioned problems, and an object of the present invention is to provide a printer capable of correctly sensing the internal ambient temperature of a printer body with no influence by an electronic component such as a power supply component reaching a high temperature.

A printer according to a first aspect of the present invention comprises a wiring board, a temperature sensor chip surface-mounted on the wiring board for sensing the internal ambient temperature of a printer body, an electronic component, other than the temperature sensor chip, provided on the wiring board and a ground pattern formed on the wiring board for grounding the temperature sensor chip and the electronic component, while a portion of the ground pattern connected to the temperature sensor chip is partially formed narrower than another portion of the ground pattern connected to the electronic component.

In the printer according to the first aspect of the present invention, as hereinabove described, the portion of the ground pattern for grounding the temperature sensor chip and the electronic component connected to the temperature sensor chip is partially formed narrower than the portion of the ground pattern connected to the electronic component, whereby heat of the electronic component can be inhibited from transmission to the temperature sensor chip through the ground pattern. Thus, the temperature sensor chip can be so prevented from influence by the heat of the electronic component that the internal ambient temperature of the printer body can be correctly sensed with the temperature sensor chip.

In the aforementioned printer according to the first aspect, the temperature sensor chip is preferably arranged in the vicinity of an edge of the wiring board. According to this structure, the distance between the temperature sensor chip and the electronic component can be increased. Thus, the heat of the electronic component can be more inhibited from transmission to the temperature sensor chip, whereby the internal ambient temperature of the printer body can be more correctly sensed with the temperature sensor chip.

In the aforementioned printer according to the first aspect, the electronic component preferably includes a supply circuit, the supply circuit is preferably arranged on a first region with respect to a centerline on the wiring board, and the temperature sensor chip is preferably arranged on a second region with respect to the centerline of the wiring board. According to this structure, the distance between the temperature sensor chip and the supply circuit can be increased. Thus, heat generated by the supply circuit can be more inhibited from transmission to the temperature sensor chip, whereby the internal ambient temperature of the printer body can be more correctly sensed with the temperature sensor chip.

In the aforementioned printer according to the first aspect, the ground pattern is preferably formed on the outermost surface of the wiring board. According to this structure, the heat is easily radiated from the ground pattern into the air when transmitted from the electronic component to the temperature sensor chip through the ground pattern as compared with a case of forming the ground pattern on an internal layer of the wiring board, whereby the heat of the electronic component can be more inhibited from transmission to the temperature sensor chip through the ground pattern.

In the aforementioned printer according to the first aspect, a narrowly formed region of the ground pattern preferably has a width larger than the width of a signal line. According to this structure, the heat of the electronic component can be inhibited from transmission to the temperature sensor chip through the ground pattern due to the narrowly formed region while reliably supplying the ground potential to the temperature sensor chip through the ground pattern having the width larger than that of the signal line.

In this case, the narrowly formed region of the ground pattern has a width substantially identical to the width of the signal line. According to this structure, the heat of the electronic component can be more inhibited from transmission to the temperature sensor chip through the ground pattern while reliably supplying the ground potential to the temperature sensor chip.

In the aforementioned printer according to the first aspect, a narrowly formed region of the ground pattern preferably includes a connecting portion connecting the portion connected with the temperature sensor chip and the portion connected with the electronic component with each other. According to this structure, the heat of the electronic component can be easily inhibited from transmission to the temperature sensor chip through the ground pattern.

In the aforementioned printer according to the first aspect, the temperature sensor chip is preferably partially arranged on a region other than the region formed with the ground pattern. According to this structure, the heat of the electronic component can be inhibited from transmission to the portion of the temperature sensor chip arranged on the region other than that formed with the ground pattern through the ground pattern, whereby the heat of the electronic component can be more inhibited from transmission to the temperature sensor chip through the ground pattern.

In the aforementioned printer according to the first aspect, the temperature sensor chip preferably includes a resistor. According to this structure, the internal ambient temperature of the printer body can be easily sensed.

The aforementioned printer according to the first aspect preferably includes a thermal transfer printer. Thus, the present invention is particularly effectively applied to the thermal transfer printer having a body whose internal ambient temperature is easily increased.

A printer according to a second aspect of the present invention comprises a wiring board, a temperature sensor chip surface-mounted in the vicinity of an edge of the wiring board for sensing the internal ambient temperature of a printer body, an electronic component, including a supply circuit other than the temperature sensor chip, provided on the wiring board and a ground pattern formed on the outermost surface of the wiring board for grounding the temperature sensor chip and the electronic component, while a portion of the ground pattern connected to the temperature sensor chip is partially formed narrower than another portion of the ground pattern connected to the electronic component with a width larger than the width of a signal line, the supply circuit is arranged on a first region with respect to a centerline on the wiring board, and the temperature sensor chip is arranged on a second region with respect to the centerline of the wiring board.

In the printer according to the second aspect of the present invention, as hereinabove described, the portion of the ground pattern for grounding the temperature sensor chip and the electronic component connected to the temperature sensor chip is partially formed narrower than the portion of the ground pattern connected to the electronic component, whereby heat of the electronic component can be inhibited from transmission to the temperature sensor chip through the ground pattern. Thus, the temperature sensor chip can be so prevented from influence by the heat of the electronic component that the internal ambient temperature of the printer body can be correctly sensed with the temperature sensor chip.

According to the second aspect, further, the temperature sensor chip is so provided on the edge of the wiring board that the distance between the temperature sensor chip and the electronic component can be increased. Thus, the heat of the electronic component can be more inhibited from transmission to the temperature sensor chip, whereby the internal ambient temperature of the printer body can be more correctly sensed with the temperature sensor chip. Further, the supply circuit is arranged on the first region with respect to the centerline of the wiring board while the temperature sensor chip is arranged on the second region with respect to the centerline of the wiring board, whereby the temperature sensor chip and the supply circuit can be separated from each other. Also according to this structure, heat generated by the supply circuit can be more inhibited from transmission to the temperature sensor chip, whereby the internal ambient temperature of the printer body can be more correctly sensed with the temperature sensor chip. In addition, the ground pattern is so formed on the outermost surface of the wiring board that the heat is more easily radiated from the ground pattern into the air when transmitted from the electronic component to the temperature sensor chip through the ground pattern as compared with a case of forming the ground pattern on an internal layer of the wiring board, whereby the heat of the electronic component can be more inhibited from transmission to the temperature sensor chip through the ground pattern. Further, the width of a narrowly formed region of the ground pattern is so rendered larger than the width of the signal line that the heat of the electronic component can be inhibited from transmission to the temperature sensor chip through the ground pattern due to the narrowly formed region while reliably supplying the ground potential to the temperature sensor chip through the ground pattern having the width larger than that of the signal line.

In the aforementioned printer according to the second aspect, a narrowly formed region of the ground pattern preferably has a width substantially identical to the width of the signal line. According to this structure, the heat of the electronic component can be more inhibited from transmission to the temperature sensor chip through the ground pattern while reliably supplying the ground potential to the temperature sensor chip.

In the aforementioned printer according to the second aspect, a narrowly formed region of the ground pattern preferably includes a connecting portion connecting the portion connected with the temperature sensor chip and the portion connected with the electronic component with each other. According to this structure, the heat of the electronic component can be easily inhibited from transmission to the temperature sensor chip through the ground pattern.

In the aforementioned printer according to the second aspect, the temperature sensor chip is preferably partially arranged on a region other than the region formed with the ground pattern. According to this structure, the heat of the electronic component can be inhibited from transmission to the portion of the temperature sensor chip arranged on the region other than that formed with the ground pattern through the ground pattern, whereby the heat of the electronic component can be more inhibited from transmission to the temperature sensor chip through the ground pattern.

In the aforementioned printer according to the second aspect, the temperature sensor chip preferably includes a resistor. According to this structure, the internal ambient temperature of the printer body can be easily sensed.

The aforementioned printer according to the second aspect preferably includes a thermal transfer printer. Thus, the present invention is particularly effectively applied to the thermal transfer printer having a body whose internal ambient temperature is easily increased.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
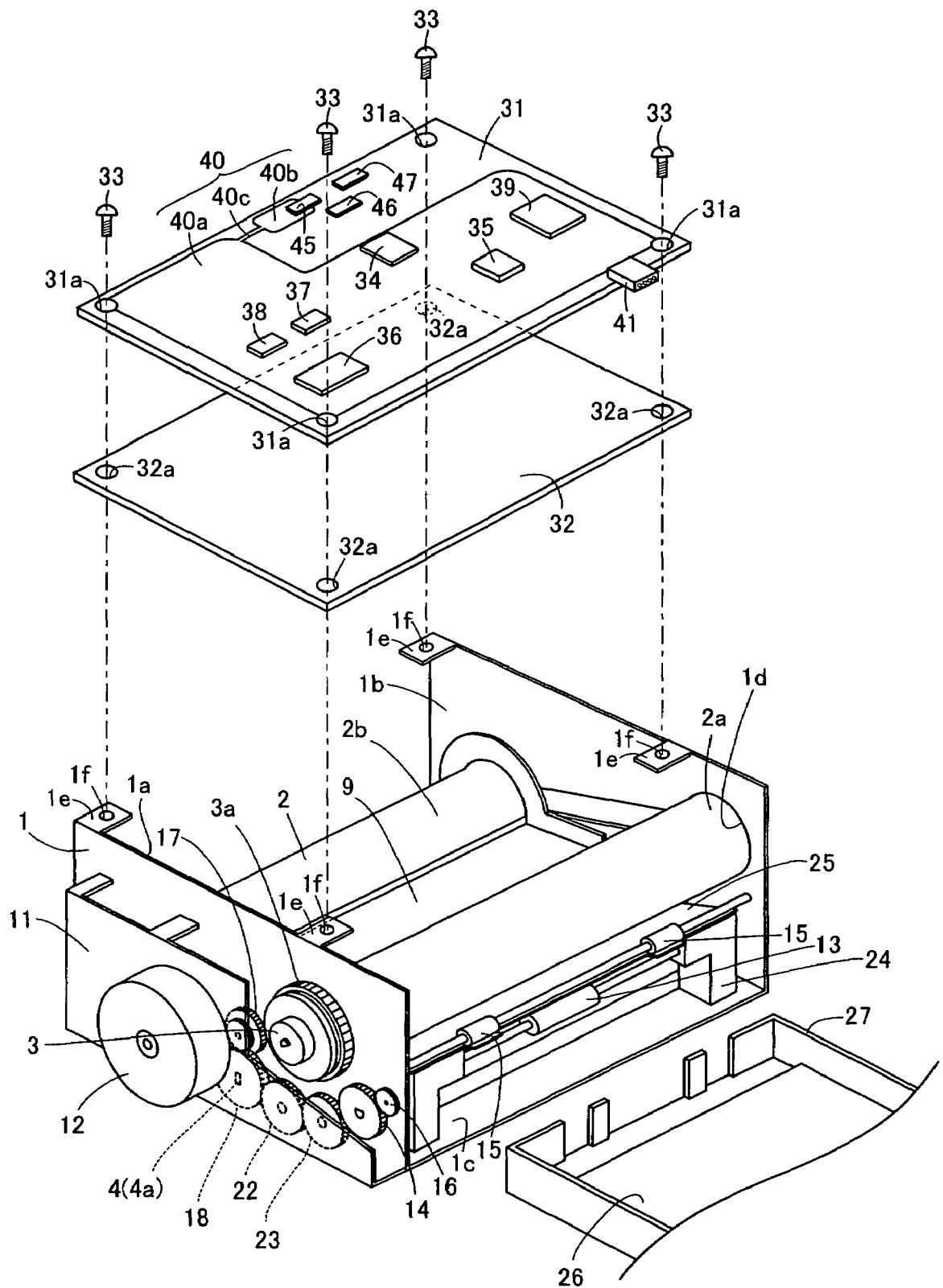
FIG. 1 is a perspective view showing the overall structure of a thermal transfer printer according to an embodiment of the present invention.

An embodiment of the present invention is now described with reference to the drawings.

First, the structure of a thermal transfer printer according to the embodiment of the present invention is described with reference to FIGS. 1 to 8.

As shown in FIGS. 1 to 8, the thermal transfer printer according to the embodiment of the present invention comprises a metal chassis 1, an ink sheet cartridge 2, a take-up reel 3, a metal feed roller 4 (see FIG. 7), a metal press roller 5 (see FIGS. 3 and 7) pressing the feed roller 4 with prescribed pressing force, a press roller bearing 6 (see FIG. 3), a bearing support plate 7 (see FIG. 3), a sheet search sensor 8 (see FIG. 7), a thermal head 9 for printing, a platen roller 10 (see FIG. 7) opposed to the thermal head 9, a motor bracket 11, a motor 12, a rubber paper feed roller 13, a paper feed roller gear 14, a rubber paper discharger roller 15, a paper discharge roller gear 16, a swingable swing gear 17, a feed roller gear 18, a plurality of intermediate gears 20 to 23 (see FIG. 5), a lower paper guide 24, a resin upper paper guide 25, a paper feed cassette case 27 for storing paper 26 supplied to the thermal transfer printer and a wiring board 31.

Figure 3:
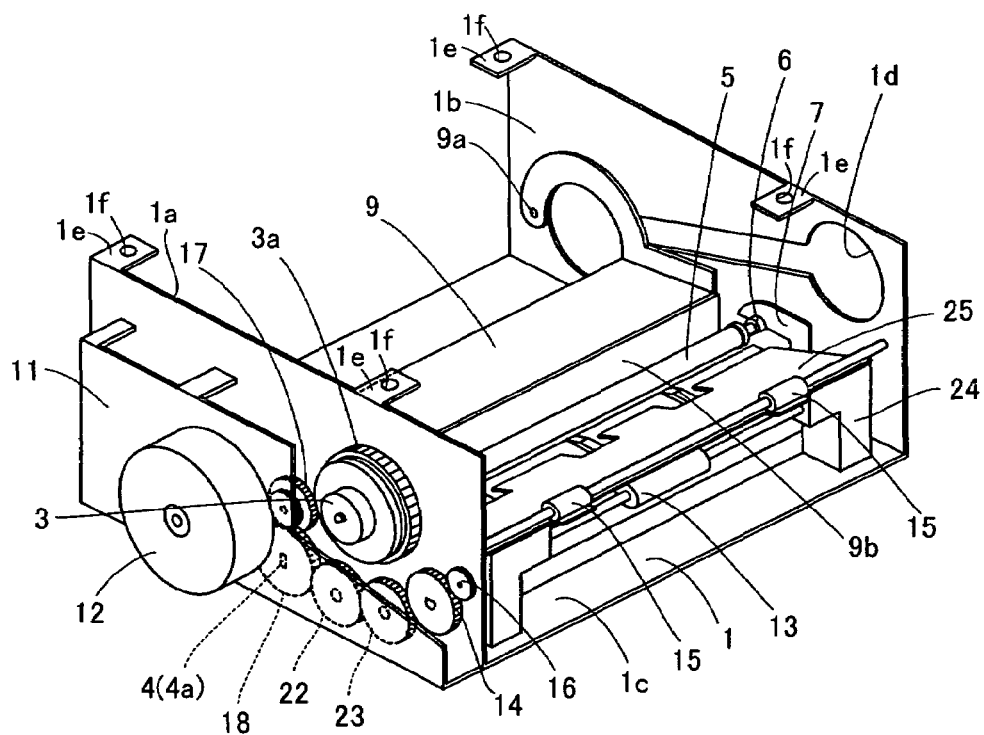
FIG. 3 is a perspective view illustrating the thermal transfer printer according to the embodiment of the present invention shown in FIG. 1 while omitting an ink cartridge and the wiring board.
Figure 4:
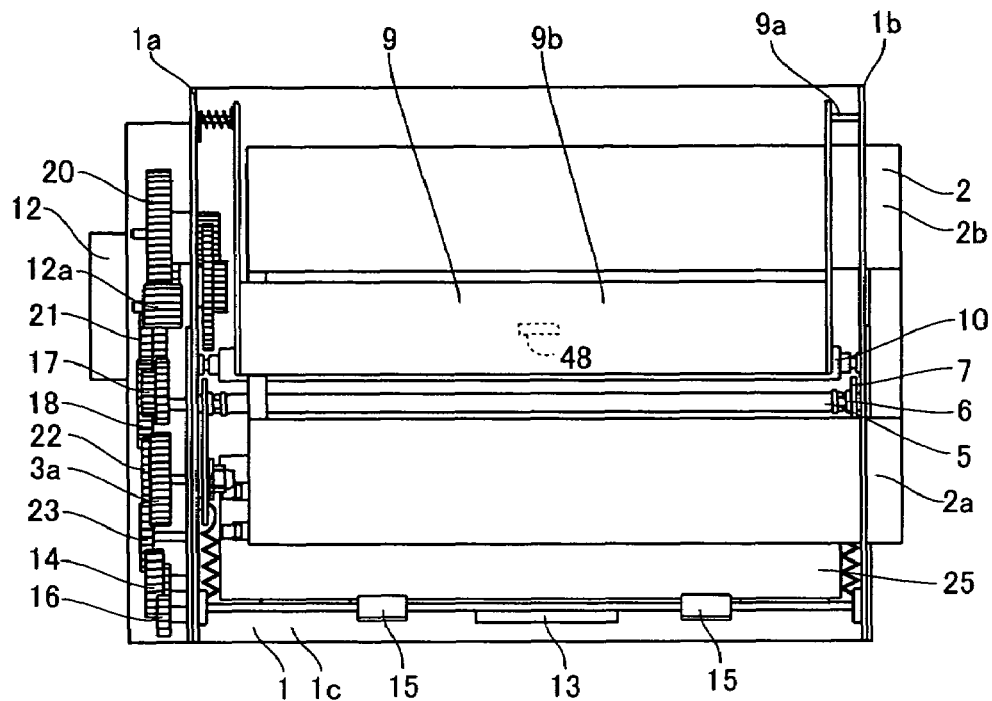
FIG. 4 is a plan view of the thermal transfer printer according to the embodiment of the present invention.

The chassis 1 has a first side surface 1a, a second side surface 1b and a bottom surface 1c, as shown in FIGS. 1 and 3. The aforementioned motor bracket 11 is mounted on the first side surface 1a of the chassis 1. A receiving hole 1d for receiving the ink sheet cartridge 2 is provided on the second side surface 1b of the chassis 1. Two mounting portions 1e for mounting the wiring board 31 are formed on the upper end of each of the first and second side surfaces 1a and 1b. The mounting portions 1e are formed with threaded holes 1f fitted with screws 33 for fixing the wiring board 31.

Figure 7:
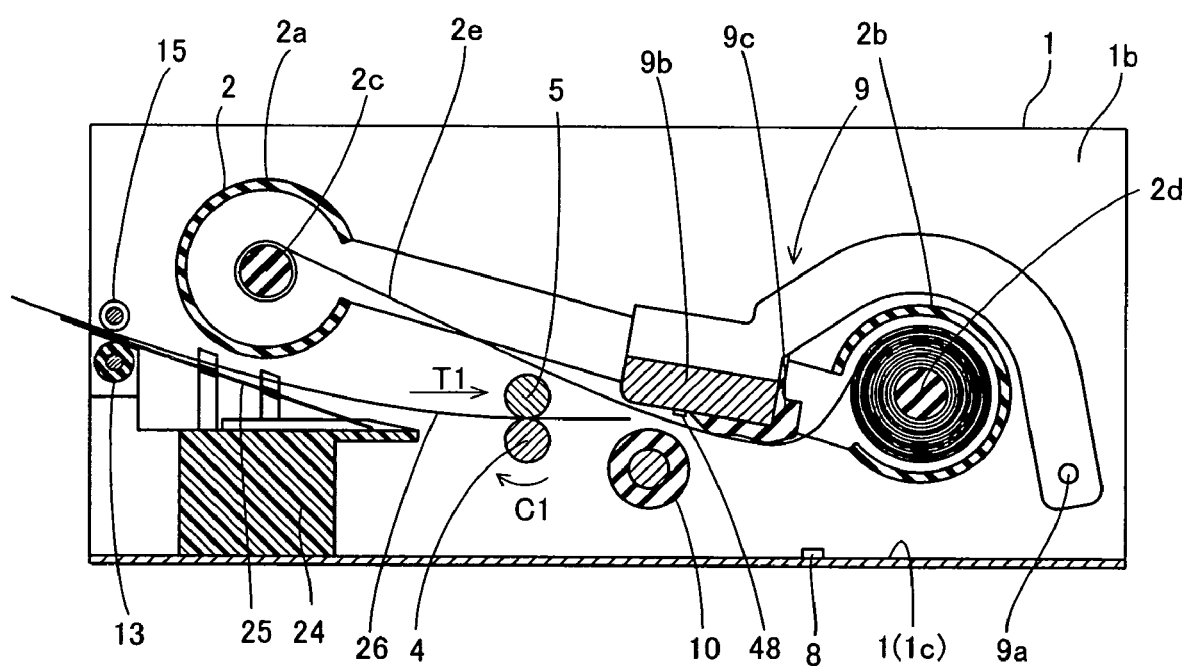
FIGS. 7 and 8 are sectional views of the thermal transfer printer according to the embodiment of the present invention.
Figure 8:
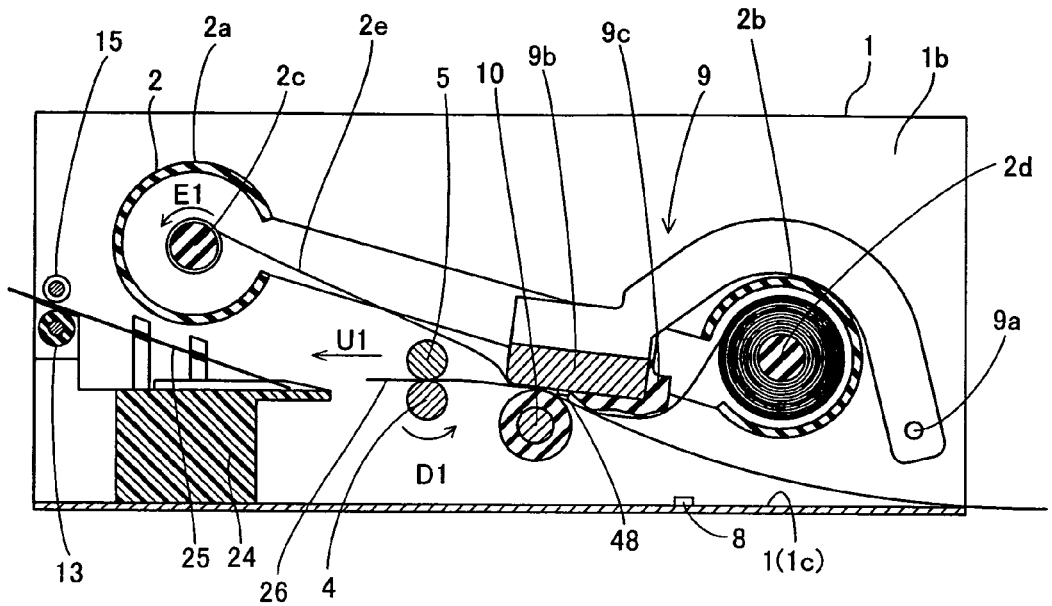

The ink sheet cartridge 2 has a take-up portion 2a and a feed portion 2b, as shown in FIGS. 1, 7 and 8. A take-up bobbin 2c is rotatably arranged in the take-up portion 2a of the ink sheet cartridge 2, as shown in FIGS. 7 and 8. A feed bobbin 2d is arranged in the feed portion 2b of the ink sheet cartridge 2. An ink sheet 2e is wound on the take-up bobbin 2c and the feed bobbin 2d. This ink sheet 2e has photographic sheets (not shown) of Y (yellow), M (magenta) and C (cyan) and a transparent OP (overcoat) photographic sheet (not shown).

Figure 5:
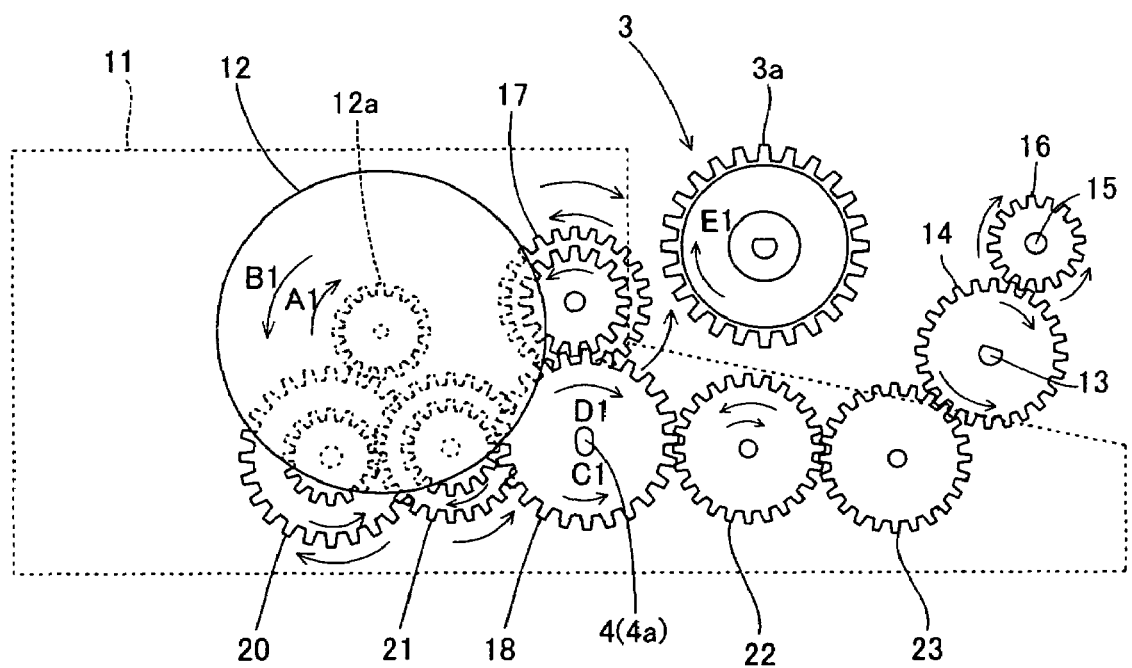
FIG. 5 is a front elevational view showing a stepping motor and gears of the thermal transfer printer according to the embodiment of the present invention.

As shown in FIG. 5, the take-up reel 3 has a function of taking up the ink sheet 2e wound on the take-up bobbin 2c by engaging with the take-up bobbin 2c arranged in the take-up portion 2a of the ink sheet cartridge 2. A gear 3a of the take-up reel 3 is arranged to mesh with the swing gear 17 upon swinging thereof.

The feed roller 4 has a feed roller gear insertional portion 4a inserted into the feed roller gear 18, as shown in FIG. 5. Further, the feed roller 4 is rotatably supported by a feed roller bearing (not shown) mounted on the chassis 1. As shown in FIG. 3, the press roller 5 is rotatably supported by the press roller bearing 6, which is mounted on the bearing support plate 7. The bearing support plate 7 is provided inside both side surfaces of the chassis 1, and arranged to press the press roller 5 against the feed roller 4. The sheet search sensor 8 has a function of identifying identification portions (not shown) between the color photographic sheets of the ink sheet 2e for searching the ink sheet 2e simultaneously with feeding of the paper 26 to a print starting position.

Figure 6:
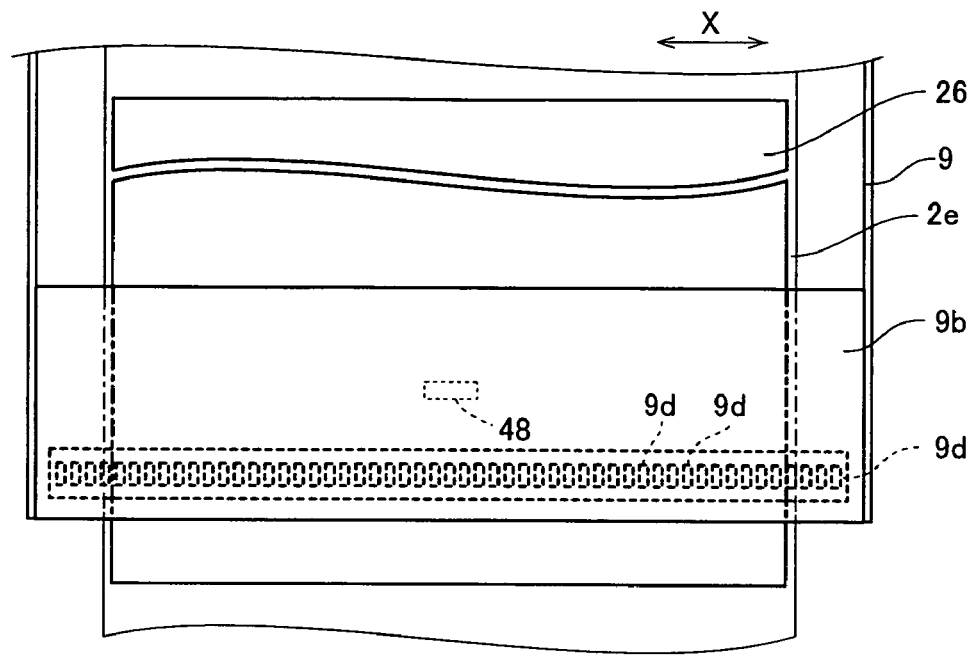
FIG. 6 is a detailed diagram of a thermal head of the thermal transfer printer according to the embodiment of the present invention.

As shown in FIGS. 6 and 7, the thermal head 9 includes a support shaft 9a, a head portion 9b and a resin head cover 9c mounted on the head portion 9b. As shown in FIG. 6, a plurality of heating elements 9d generating heat through application of voltage pulses are aligned with each other on the head portion 9b of the thermal head 9 at prescribed intervals along the width direction of the paper 26 (along arrow X in FIG. 6). As shown in FIG. 3, the thermal head 9 is rotatably mounted inside both side surfaces of the chassis 1 to be rotatable about the support shaft 9a. As shown in FIGS. 6 and 7, a temperature sensor chip 48 for sensing the temperature around the thermal head 9 is provided on the bottom surface of the thermal head 9. The platen roller 10 is rotatably supported by platen roller bearings (not shown) mounted on both side surfaces of the chassis 1.

As shown in FIG. 5, a motor gear 12a is mounted on a shaft portion of the motor 12 mounted on the motor bracket 11. The motor 12 functions as a drive source for driving the gear 3a of the take-up reel 3, the paper feed roller gear 14, the paper discharge roller gear 16 and the feed roller gear 18.

As shown in FIGS. 7 and 8, the lower paper guide 24 is set in the vicinity of the feed roller 4 and the press roller 5. The upper paper guide 25 is mounted on the upper portion of the lower paper guide 24. The upper paper guide 25 has a function of guiding the paper 26 to a paper feed path toward a printing portion through the lower surface thereof in paper feeding, while guiding the paper 26 to a paper discharge path through the upper surface thereof in paper discharge.

Figure 2:
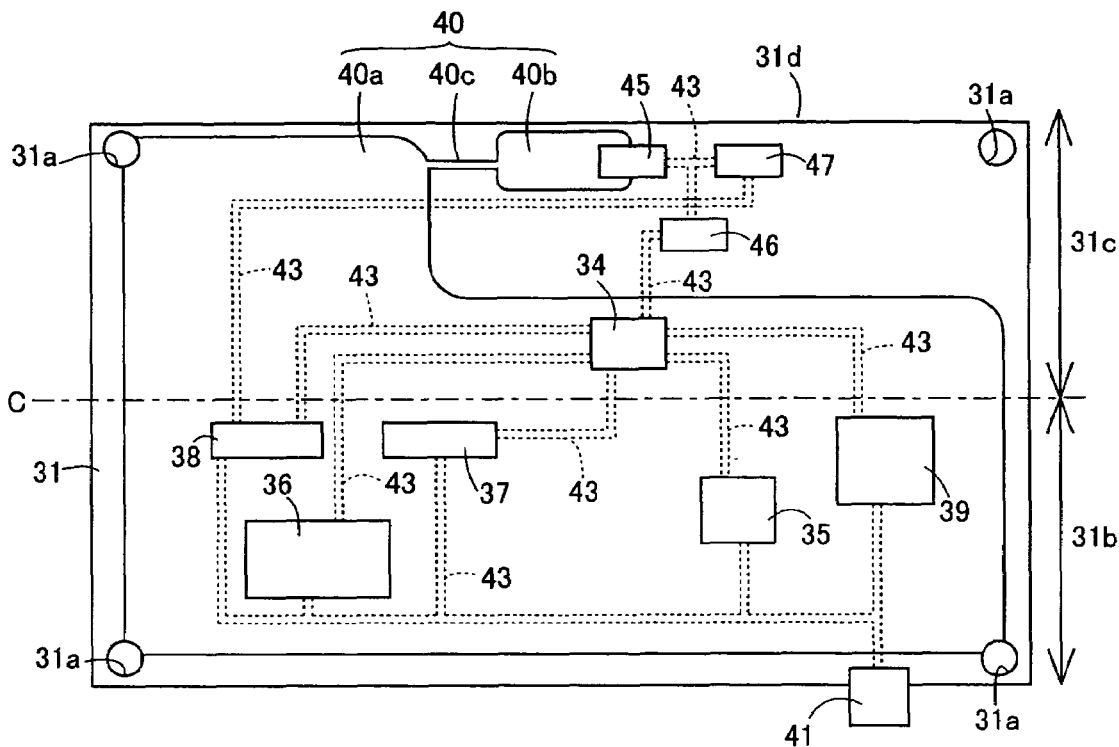
FIG. 2 is a plan view of a wiring board of the thermal transfer printer according to the embodiment of the present invention shown in FIG. 1.

The wiring board 31 is formed by a plurality of layers (four layers, for example). As shown in FIG. 1, this wiring board 31 is mounted on the mounting portions 1e of the chassis 1 through a top plate 32. More specifically, the wiring board 31 is fixed by fastening the four screws 33 passing through four holes 31a of the wiring board 31 and four holes 32a of the top plate 32 respectively to the threaded holes 1f of the mounting portions 1e of the chassis 1. A control portion 34, four DC-DC converters 35, 36, 37 and 38, a motor driver 39, a ground pattern 40, a DC jack 41, a temperature sensor chip (chip thermistor) 45, an A-D converter 46 and a pull-up resistor 47 are provided on the outermost surface of the wiring board 31, as shown in FIGS. 1 and 2. The four DC-DC converters 35 to 38 are examples of the "supply circuit" or the "electronic component" in the present invention, and the motor driver 39 is an example of the "electronic component" in the present invention.

The four DC-DC converters 35 to 38, the motor driver 39 and the temperature sensor chip 45 are connected to the control portion 34 through signal lines 43 of about 0.4 mm in width formed on an internal layer of the wiring board 31. The four DC-DC converters 35 to 39 and the motor driver 39 are also connected to the DC jack 41 through the signal lines 43 formed on the internal layer of the wiring board 31. The four DC-DC converters 35 to 38, the motor driver 39 and the temperature sensor chip 45 are provided on the outermost surface of the wiring board 31 by surface mounting, which is a system of fitting these elements into the surface of the wiring board 31. The temperature sensor chip 45 can sense ambient temperatures of about 0° C. to about 40° C.

According to this embodiment, the ground pattern 40 is formed to cover about ¾ of the outermost surface of the wiring board 31 and grounded to the chassis 1 (mounting portions 1e) through the metal screws 33 (see FIG. 1), as shown in FIG. 2. Thus, the ground pattern 40 has a function of grounding electronic components such as the four DC-DC converters 35 to 38 and the motor driver 39. Further, a region 40a of the ground pattern 40 connected with the four DC-DC converters 35 to 38 and the motor driver 39 generating heat up to a temperature of about 50° C. to about 60° C. and another region 40b of the ground pattern 40 connected with the temperature sensor chip 45 are connected with each other through a thin connecting portion 40c having a width of about 0.4 mm, which is identical to the width of the signal lines 43, as shown in FIG. 2. The connecting portion 40c has a function of inhibiting the heat of the DC-DC converters 35 to 38 and the motor driver 39 connected to the region 40a from transmission to the temperature sensor chip 45 connected to the region 40b. The temperature sensor chip 45 is partially arranged on a region other than that formed with the ground pattern 40.

According to this embodiment, a region 31b provided with the four DC-DC converters 35 to 38 and the motor driver 39 reaching high temperatures by heat generation is arranged on a side opposite to another region 31c provided with the temperature sensor chip 45 sensing the internal ambient temperature of the thermal transfer printer through a centerline C of the wiring board 31. The temperature sensor chip 45 is arranged in the vicinity of a substantially central portion of an edge 31d of the region 31c of the wiring board 31.

The circuit structures of the electronic components, including the temperature sensor chips 45 and 48 and power supply components, of the thermal transfer printer according to the embodiment of the present invention are now described with reference to FIGS. 9 and 10.

Figure 9:
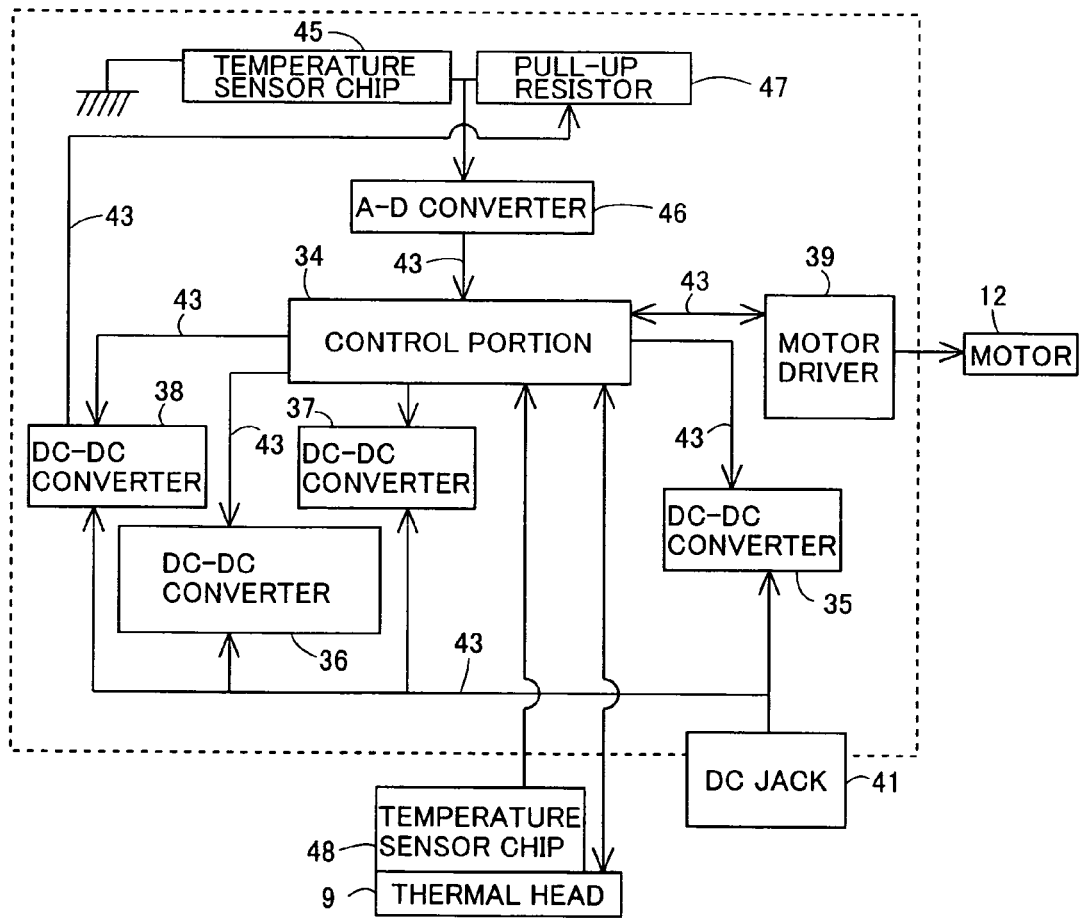
FIG. 9 is a block diagram showing the circuit structure of the thermal transfer printer according to the embodiment of the present invention shown in FIG. 2.
Figure 10:
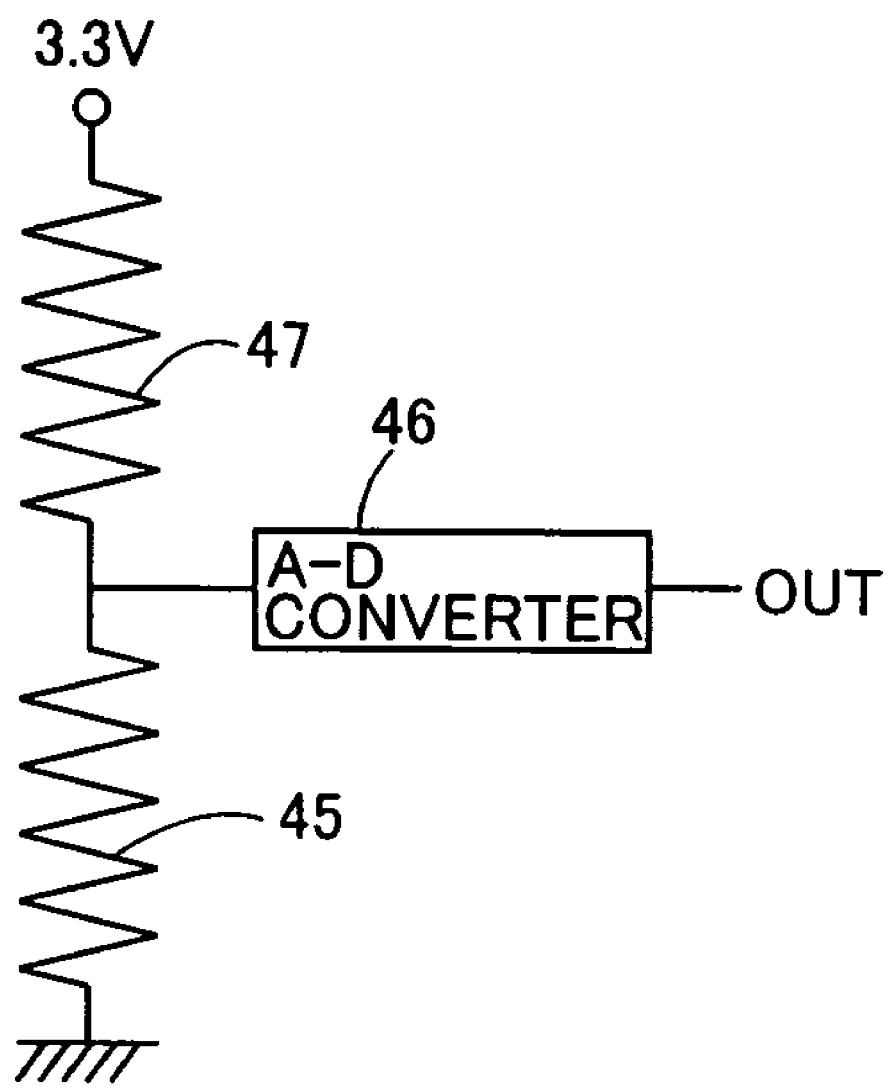
FIG. 10 is a circuit block diagram of a temperature sensor chip and the periphery thereof shown in FIG. 9.

According to this embodiment, the thermal transfer printer is provided with the control portion 34, the four DC-DC converters 35 to 38, the motor driver 39, the DC jack 41, the temperature sensor chip 45 for sensing the internal ambient temperature of the thermal transfer printer, the A-D converter 46, the pull-up resistor 47 and the temperature sensor chip 48 for sensing the peripheral temperature of the thermal head 9, as shown in FIG. 9. The control portion 34 is constituted of a CPU, a RAM or a ROM. The temperature sensor chips 45 and 48 for sensing the internal ambient temperature of the thermal transfer printer and the peripheral temperature of the thermal head 9 respectively are connected to the control portion 34. The control portion 35 controls the heating elements 9d of the thermal head 9 etc. on the basis of the temperatures sensed by the temperature sensor chips 45 and 48 respectively. The thermal head 9 and the temperature sensor chip 48 for sensing the peripheral temperature of the thermal head 9 are also connected to the control portion 34. The temperature sensor chip 48 is identical in structure to the temperature sensor chip 45.

The pull-up resistor 47 is supplied with a voltage of 3.3 V from the DC-DC converter 38 through the corresponding signal line 43. Each of the pull-up resistor 47 and the temperature sensor chip 45 is formed by a resistor having a resistance value of 10 KΩ±1.0% at 25° C. The temperature sensor chip 45 has a B constant of about 3400 K. The internal ambient temperature of the thermal transfer printer varies in the range of about 0° C. to about 40° C, and the resistance value of the temperature sensor chip 45 varies with this temperature change. The A-D converter 46 converts a voltage corresponding to the change of the resistance value to a digital signal (voltage), and outputs the same to the control portion 34. The motor 12 is also connected to the control portion 34 through the motor driver 39.

Operations of feeding the paper 26 and taking up the ink sheet 2e following printing of the thermal transfer printer according to this embodiment are now described with reference to FIGS. 5, 7 and 8. In paper feeding, the motor 12 is driven to rotate the motor gear 12a mounted thereon along arrow A1 in FIG. 5, for rotating the feed roller gear 18 along arrow C1 in FIG. 5 through the intermediate gears 20 and 21. Thus, the feed roller 4 is rotated along arrow C1 shown in FIGS. 5 and 7, for carrying the paper 26 in a paper feed direction (along arrow T1 in FIG. 7). At this time, the swingable swing gear 17 is not in mesh with the gear 3a of the take-up reel 3, not to rotate the gear 3a. Thus, the ink sheet 2e wound on the take-up bobbin 2c and the feed bobbin 2d is not taken up in paper feeding.

When the paper 26 is delivered (fed) from the paper feed cassette case 27 toward the printing start position, a determination is made as to whether or not the paper 26 has reached the printing start position. Simultaneously with the feeding of the paper 26 to the printing start position, the sheet search sensor 8 identifies the corresponding identification portion of the ink sheet 2e shown in FIGS. 6 and 7, thereby searching the ink sheet 2e.

In paper discharge (printing), the motor 12 is driven to rotate the motor gear 12a mounted thereon along arrow B1 in FIG. 5, for rotating the feed roller gear 18 along arrow D1 in FIG. 5 through the intermediate gears 20 and 21. Thus, the feed roller 4 is rotated along arrow D1 in FIGS. 5 and 8, for carrying the paper 26 in a printing direction (along arrow U1 in FIG. 8). At this time, the swingable swing gear 17 meshes with the gear 3a of the take-up reel 3, for rotating the gear 3a along arrow E1 in FIGS. 5 and 8. Thus, the take-up bobbin 2c engaging with the take-up reel 3 is also rotated along arrow E1 in FIGS. 5 and 8, thereby taking up the ink sheet 2e wound on the take-up bobbin 2c and the feed bobbin 2d. The thermal transfer printer performs the aforementioned paper feed operation and the aforementioned paper discharge (printing) operation as to each of the sheets of cyan, magenta, yellow and OP, thereby printing images on a photographic paper.

According to this embodiment, as hereinabove described, the connecting portion 40c of the ground pattern 40 connecting the region 40b of the ground pattern 40 for grounding the temperature sensor chip 45 and the region 40a of the ground pattern 40 for grounding the DC-DC converters 35 to 38 and the motor driver 39 with each other is formed narrower than the remaining regions 40a and 40b of the ground pattern, whereby the heat generated by the DC-DC converters 35 to 38 and the motor driver 39 can be inhibited from transmission to the temperature sensor chip 45 through the ground pattern 40. Thus, the temperature sensor chip 45 can be prevented from influence by the heat of the DC-DC converters 35 to 38 and the motor driver 39, whereby the internal ambient temperature of the thermal transfer printer can be correctly sensed with the temperature sensor chip 45.

According to this embodiment, the temperature sensor chip 45 is arranged on the edge of the wiring board 31 and the DC-DC converters 35 to 38 and the motor driver 39 are arranged on the region 31b located on one side of the centerline C of the wiring board 31 while the temperature sensor chip 45 is arranged on the other region 31c located on the other side of the centerline C of the wiring board 31, whereby the distances between the temperature sensor chip 45 and the DC-DC converters 35 to 38 as well as the motor driver 39 can be increased. Thus, the heat generated by the DC-DC converters 35 to 38 and the motor driver 39 can be more inhibited from transmission to the temperature sensor chip 45, whereby the internal ambient temperature of the thermal transfer printer can be more correctly sensed with the temperature sensor chip 45.

According to this embodiment, the ground pattern 40 is formed on the outermost surface of the wiring board 31 so that the heat transmitted from the DC-DC converters 35 to 38 and the motor driver 39 to the temperature sensor chip 45 through the ground pattern 40 is more easily radiated into the air as compared with a case of forming the ground pattern 40 on the internal layer of the wiring board 31, whereby the heat of the DC-DC converters 35 to 38 and the motor driver 39 can be more inhibited from transmission to the temperature sensor chip 45. Further, the thin connecting portion 40c of the ground pattern 40 has the width identical to that of the signal lines 43, whereby the heat of the DC-DC converters 35 to 38 and the motor driver 39 can be inhibited from transmission to the temperature sensor chip 45 due to the connecting portion 40c formed narrower than the remaining portion of the ground pattern 40 while reliably supplying the ground potential to the temperature sensor chip 45.

According to this embodiment, the temperature sensor chip 45 is partially arranged on the region other than that formed with the ground pattern 40, whereby the heat of the DC-DC converters 35 to 38 and the motor driver 39 can be inhibited from transmission to the portion of the temperature sensor chip 45 arranged on the region other than that formed with the ground pattern 40 through the region 40b (ground pattern 40).

Although the present invention has been described and illustrated in detail, it is clearly understood that the same is by way of illustration and example only and is not to be taken by way of limitation, the spirit and scope of the present invention being limited only by the terms of the appended claims.

For example, while the aforementioned embodiment of the present invention is applied to the thermal transfer printer, the present invention is not restricted to this but is also applicable to another printer.

While the connecting portion 40c of the ground pattern 40 is formed in the vicinity of the temperature sensor chip 45 in the aforementioned embodiment, the present invention is not restricted to this but the connecting portion 40c of the ground pattern 40 may alternatively be formed on a portion other than the portion close to the temperature sensor chip 45, so far as the same is formed between heat generating components such as the DC-DC converters 35 to 38 and the temperature sensor chip 45.

While the A-D converter 46 digitally converts the output of the temperature sensor chip 45 in the aforementioned embodiment, the present invention is not restricted to this but the temperature sensor chip 45 may alternatively output an analog signal as such.

While the region 31b of the wiring board 31 provided with the DC-DC converters 35 to 38 and the motor driver 39 and the region 31c of the wiring board 31 provided with the temperature sensor chip 45 are opposed to each other through the centerline C of the wiring board 31 in the aforementioned embodiment, the present invention is not restricted to this but the arrangements of the electronic components, the temperature sensor chip 45 and the regions 31b and 31c are properly changeable. However, the heat generating components such as the DC-DC converters 35 to 38 and the motor driver 39 and the temperature sensor chip 45 are preferably separated from each other to the utmost.

While the ground pattern 40 is formed on the outermost surface of the wiring board 31 in the aforementioned embodiment, the present invention is not restricted to this but the ground pattern 40 may alternatively be formed on the internal layer of the wiring board 31 formed by the plurality of layers.

While the connecting portion 40c of the ground pattern 40 has the width identical to that of the signal lines 43 in the aforementioned embodiment, the present invention is not restricted to this but the width of the connecting portion 40c of the ground pattern 40 is properly changeable so far as the same is smaller than those of the remaining regions 40a and 40b of the ground pattern 40. In order to reliably supply the ground potential to the temperature sensor chip 45, however, the connecting portion 40c of the ground pattern 40 is preferably set to a width larger than that of the signal lines 43.

What is claimed is:

1. A printer comprising:
    a wiring board;
    a temperature sensor chip surface-mounted on said wiring board for sensing the internal ambient temperature of a printer body;
    an electronic component, other than said temperature sensor chip, provided on said wiring board;
    a signal line formed on an internal layer of the wiring board; and
    a ground pattern formed on the outermost surface of said wiring board for grounding said temperature sensor chip and said electronic component, wherein
    a portion of said ground pattern connected to said temperature sensor chip is partially formed narrower than another portion of said ground pattern connected to said electronic component.

2. The printer according to claim 1, wherein
    said temperature sensor chip is arranged in the vicinity of an edge of said wiring board.

3. The printer according to claim 1, wherein
    said electronic component includes a supply circuit,
    said supply circuit is arranged on a first region with respect to a centerline on said wiring board, and
    said temperature sensor chip is arranged on a second region with respect to said centerline of said wiring board.

4. The printer according to claim 1, wherein
    a narrowly formed region of said ground pattern has a width larger than the width of a signal line.

5. The printer according to claim 4, wherein
    said narrowly formed region of said ground pattern has a width substantially identical to the width of said signal line.

6. The printer according to claim 1, wherein
    a narrowly formed region of said ground pattern includes a connecting portion connecting said portion connected with said temperature sensor chip and said portion connected with said electronic component with each other.

7. The printer according to claim 1, wherein
    said temperature sensor chip is partially arranged on a region other than the region formed with said ground pattern.

8. The printer according to claim 1, wherein
    said temperature sensor chip includes a resistor.

9. The printer according to claim 1, including a thermal transfer printer.

10. A printer comprising:
    a wiring board;
    a temperature sensor chip surface-mounted in the vicinity of an edge of said wiring board for sensing the internal ambient temperature of a printer body;
    an electronic component, including a supply circuit other than said temperature sensor chip, provided on said wiring board; and
    a ground pattern formed on the outermost surface of said wiring board for grounding said temperature sensor chip and said electronic component, wherein
    a portion of said ground pattern connected to said temperature sensor chip is partially formed narrower than another portion of said ground pattern connected to said electronic component with a width larger than the width of a signal line,
    said signal line is formed on an internal layer of said wiring board, and
    said supply circuit is arranged on a first region with respect to a centerline on said wiring board while said temperature sensor chip is arranged on a second region with respect to said centerline of said wiring board.

11. The printer according to claim 10, wherein
    a narrowly formed region of said ground pattern has a width substantially identical to the width of said signal line.

12. The printer according to claim 10, wherein a narrowly formed region of said ground pattern includes a connecting portion connecting said portion connected with said temperature sensor chip and said portion connected with said electronic component with each other.

13. The printer according to claim 10, wherein
    said temperature sensor chip is partially arranged on a region other than the region formed with said ground pattern.

14. The printer according to claim 10, wherein said temperature sensor chip includes a resistor.

15. The printer according to claim 10, including a thermal transfer printer.

* * * * *